(12) United States Patent
Beer et al.

(10) Patent No.: US 7,208,047 B2
(45) Date of Patent: Apr. 24, 2007

(54) APPARATUS AND METHOD FOR THERMALLY ISOLATING A HEAT CHAMBER

(75) Inventors: Emanuel Beer, San Jose, CA (US); Kenneth E. Baumel, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 25 days.

(21) Appl. No.: 10/736,196

(22) Filed: Dec. 15, 2003

(65) Prior Publication Data
US 2004/0123953 A1  Jul. 1, 2004

Related U.S. Application Data

(63) Continuation of application No. 09/891,784, filed on Jun. 25, 2001, now abandoned.

(51) Int. Cl.
| | |
|---|---|
| C23C 16/00 | (2006.01) |
| C23F 1/00 | (2006.01) |
| B65G 29/00 | (2006.01) |
| F27D 3/00 | (2006.01) |
| H01L 21/306 | (2006.01) |

(52) U.S. Cl. ............ 118/719; 156/345.31; 156/345.32; 414/150; 414/172; 414/222.07; 414/939; 432/245

(58) Field of Classification Search ........... 156/345.31, 156/345.32; 118/719, 733; 414/935, 939, 414/150, 172, 222.07; 34/209, 242; 432/242, 432/245
See application file for complete search history.

(56) References Cited

U.S. PATENT DOCUMENTS

| | | | |
|---|---|---|---|
| 2,831,951 A | 4/1958 | Desloge | |
| 3,759,662 A | 9/1973 | Bengel et al. | |
| 3,866,926 A | * 2/1975 | Traum | ........................ 277/593 |
| 3,978,815 A | 9/1976 | Carrara | |
| 4,015,558 A | 4/1977 | Small et al. | |
| 4,376,672 A | 3/1983 | Wang et al. | |
| 4,427,378 A | 1/1984 | Bowers | |

(Continued)

FOREIGN PATENT DOCUMENTS

JP            61161710 A       7/1986

(Continued)

OTHER PUBLICATIONS

Sybil P. Parker, Chief Editor, "McGraw-Hill Encyclopedia of Physics", Second Edition, McGraw-Hill, Inc., p. 205-212, 1993.

(Continued)

*Primary Examiner*—Karla Moore
(74) *Attorney, Agent, or Firm*—Dugan & Dugan (57) ABSTRACT

An apparatus through which a substrate may be transferred between a first chamber and a second chamber in which the first chamber is maintained at a high temperature relative to the ambient temperature of the second chamber. The apparatus comprises a passageway for receiving the substrate and a thermally isolating interface. The thermally isolating interface reduces heat transfer from the first chamber to the second chamber and allows for transfer of the substrate between the apparatus and the second chamber. The thermally isolating interface includes a hole having dimensions such that the substrate is transferrable through the thermally isolating interface.

18 Claims, 8 Drawing Sheets

U.S. PATENT DOCUMENTS

| | | | |
|---|---|---|---|
| 4,497,364 A | 2/1985 | Cheadle et al. | |
| 4,531,047 A | 7/1985 | Canfield et al. | |
| 4,531,074 A | 7/1985 | Nagy et al. | |
| 4,586,898 A | 5/1986 | Orbeck | |
| 4,997,364 A * | 3/1991 | McGrath et al. | 432/59 |
| 5,017,131 A | 5/1991 | Sato et al. | |
| 5,108,792 A | 4/1992 | Anderson et al. | |
| 5,121,705 A | 6/1992 | Sugino | |
| 5,172,849 A | 12/1992 | Barten et al. | |
| 5,215,315 A | 6/1993 | Belter | |
| 5,223,113 A * | 6/1993 | Kaneko et al. | 204/298.33 |
| 5,256,061 A | 10/1993 | Cress | |
| 5,286,296 A * | 2/1994 | Sato et al. | 118/719 |
| 5,294,572 A | 3/1994 | Granneman et al. | |
| 5,381,014 A * | 1/1995 | Jeromin et al. | 250/370.09 |
| 5,441,768 A | 8/1995 | Law et al. | |
| 5,512,320 A | 4/1996 | Turner et al. | |
| 5,601,686 A | 2/1997 | Kawamura et al. | |
| 5,607,009 A | 3/1997 | Turner et al. | |
| 5,614,055 A | 3/1997 | Fairbairn et al. | |
| 5,769,952 A | 6/1998 | Komino | |
| 5,861,107 A | 1/1999 | Buysch et al. | |
| 5,865,896 A | 2/1999 | Nowak et al. | |
| 5,928,732 A | 7/1999 | Law et al. | |
| 5,950,328 A | 9/1999 | Ichiko et al. | |
| 5,980,991 A | 11/1999 | Sakamoto et al. | |
| 6,000,227 A | 12/1999 | Kroeker | |
| 6,037,574 A | 3/2000 | Lanham et al. | |
| 6,054,688 A | 4/2000 | Moschini | |
| 6,261,091 B1 | 7/2001 | Sakamoto et al. | |
| 6,284,006 B1 | 9/2001 | Siefering et al. | |
| 2003/0118966 A1 * | 6/2003 | Tsutsui et al. | 432/128 |

FOREIGN PATENT DOCUMENTS

JP  01082453 A  3/1989

OTHER PUBLICATIONS

Watlow, "Heated Parts (Cast-in and IFC)", www.watlow.com, Printed Mar. 29, 2001.

Watlow, "Functional Components Custom Design For Your Application", www.watlow.com, Watlow Electric Manufacturing Company, 1998.

Ivan Noels, "Thermal Conductivity of the Elements", http://le-village.ifrance.com/okapi/thermal_conductivity.htm, Printed Mar. 30, 2001.

* cited by examiner

APPARATUS AND METHOD FOR THERMALLY ISOLATING A HEAT CHAMBER

This application is a continuation of U.S. patent application Ser. No. 09/891,784 filed Jun. 25, 2001 now abandoned, which is hereby incorporated by reference herein in its entirety.

FIELD OF THE INVENTION

The present invention generally relates to an apparatus through which a substrate may be transferred between a heat chamber and a second chamber, such as a central transfer chamber, to effect a semiconductor or glass substrate processing regimen. The present invention has application in a broad array of manufacturing processes, leading to improved semiconductors or flat panel display yields. Further, the invention also has application in prolonging the life of equipment used in such manufacturing processes.

BACKGROUND

Semiconductor devices are typically made in highly automated systems. Many of these systems include a central transfer chamber mounted on a monolithic platform. The central transfer chamber transfers semiconductor substrates to one or more specialized chambers or reactors located on the periphery of the transfer chamber. The specialized chambers or reactors are used to conduct the various specialized etching, chemical vapor deposition, diffusion, and annealing processes that are necessary to process the substrate. Similar such equipment is used in the manufacture of flat panel displays, as well as various optical components such as couplers, splitters, filters, array waveguide gratings, Bragg gratings, taps, attenuators, multiplexers, and de-multiplexers. Many of these processes are performed at controlled temperatures and very low pressures.

System Architecture

Figure 1A:
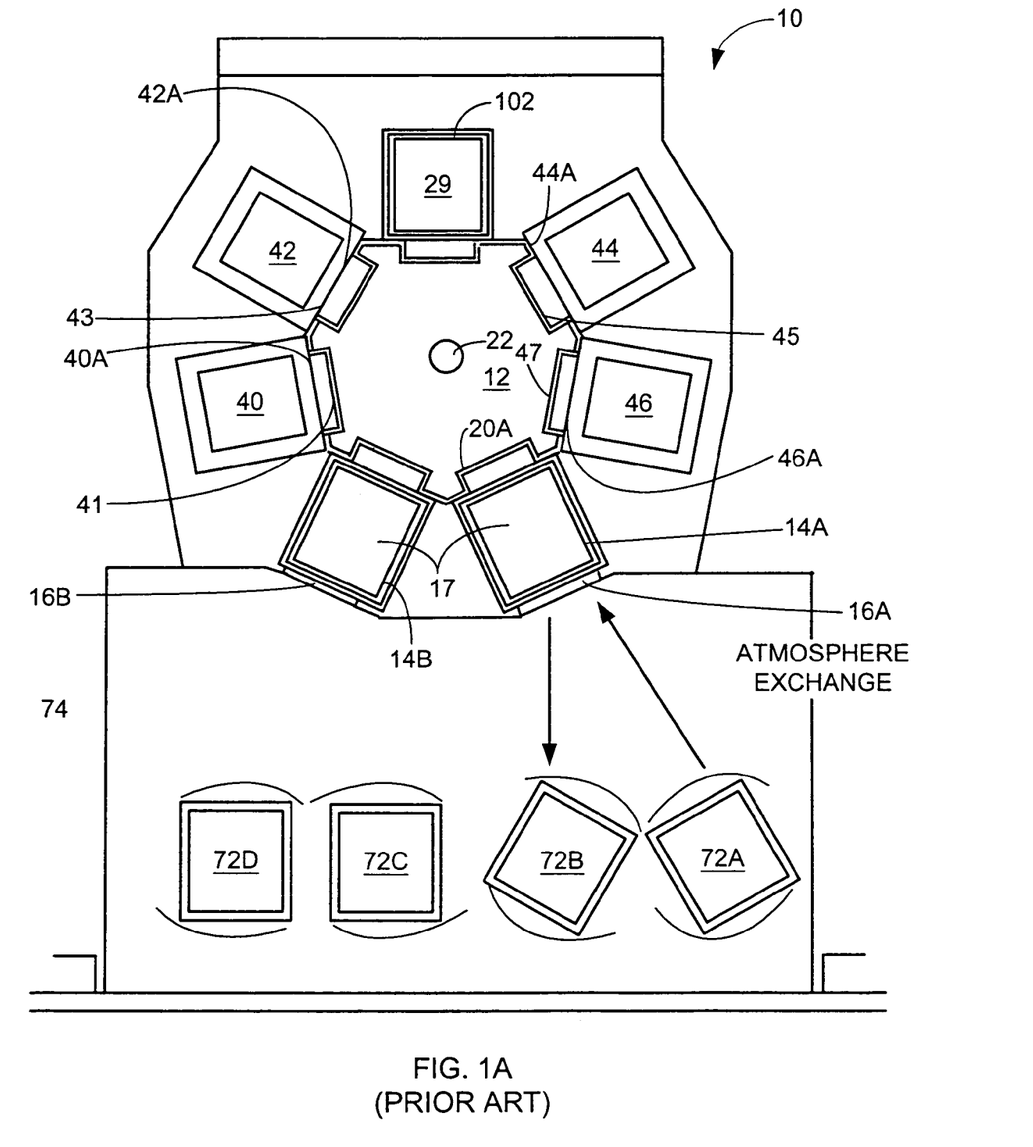
FIG. 1A is a plan view of a prior art vacuum system.

FIG. 1A illustrates a representative modular architecture 10 for processing substrates. Architecture 10 comprises a central transfer chamber 12 to which are connected load lock/cooling chambers 14A and 14B, each for transferring substrates into system 10, heating chamber 102, and processing chambers 40, 42, 44, and 46. Central transfer chamber 12, loadlock/cooling chambers 14A and 14B, heating chamber 102, and processing chambers 40, 42, 44, and 46 are sealed together for a closed environment in which the system may be operated at internal pressures considerably less than standard atmospheric pressure. For example, a representative pressure is about $10^{-3}$ Torr. Load lock/cooling chambers 14A and 14B have closable openings comprising load doors 16A and 16B, respectively, on their outside walls for transfer of substrates into system 10.

Load lock/cooling chambers 14A and 14B each contain a cassette 17 fitted with a plurality of shelves for supporting and cooling substrates. Cassettes 17 in load lock/cooling chambers 14 are mounted on an elevator assembly (not shown) to raise and lower the cassettes 17 incrementally by the height of one shelf. To load chamber 14A, load door 16A is opened and a substrate 72 is placed on a shelf in cassette 17. The elevator assembly then raises cassette 17 by the height of one shelf so that an empty shelf is opposite load door 16A. Another substrate is placed on that shelf and the process is repeated until all of the shelves of cassette 17 are filled. At that point, load door 16A is closed and chamber 14A is evacuated to the pressure in system 10.

A slit valve 20A on the inside wall of load lock/cooling chamber 14A adjacent to central transfer chamber 12 is then opened. The substrates are transferred by means of a robot 22 in central transfer chamber 12 to a heating chamber 102 where they are heated to the temperature required for processing operations described below. Robot 22 is controlled by a microprocessor control system (not shown). Robot 22 is used to withdraw a substrate from cassette 17 of load lock/cooling chamber 14A, insert the substrate onto an empty shelf in heating chamber cassette 29 and withdraw, leaving the substrate on a shelf within heating chamber 102. Typically, heating chamber cassette 29 is mounted on an elevator assembly within heating chamber 102. After loading one shelf, heating chamber cassette 29 is raised or lowered to present another empty shelf for access by robot 22. Robot 22 then retrieves another substrate from cassette 17 of load lock/cooling chamber 14A.

In like manner, robot 22 transfers all or a portion of the substrates from heating chamber cassette 29 to one of four single substrate processing chambers 40, 42, 44 and 46. Processing chambers 40, 42, 44 and 46 are adapted to deposit one or more thin layers onto the substrates. Each of the film chambers 40, 42, 44 and 46 is also fitted on its inner walls 40a, 42a, 44a and 46a, respectively, with a slit valve 41, 43, 45 and 47, respectively, for isolation of process gases.

At the end of film processing, each hot substrate is transferred to cooling cassette 17 of load lock/cooling chamber 14A, one substrate being placed onto each shelf, with the elevator mechanism raising and lowering cassette 17 to present an empty shelf to transfer robot 22 for each substrate.

Various chambers and reactors used in a typical modular architecture based system such as a cluster tool are described in the prior art. For example, U.S. Pat. No. 4,367,672, Wang, et al. discloses methods of using a plasma to selectively etch holes or trenches in a film layer on a semiconductor substrate. Similarly, U.S. Pat. No. 5,614,055, Fairburn, et al., discloses a high density plasma chemical vapor deposition and etching reactor. U.S. Pat. No. 5,865,896, Nowak et al., discloses a high density plasma chemical vapor deposition reactor with combined inductive and capacitive cooling. U.S. Pat. No. 5,108,792, Anderson, et al., discloses a double-dome reactor for semiconductor processing. U.S. Pat. No. 6,000,227 discloses a representative central transfer chamber that is cooled.

Various chambers and vacuum systems are commercially available. A representative commercial embodiment of a vacuum system is the AKT processing system which is available from AKT, Inc., located in Santa Clara, Calif. An exemplary processing chamber is an AKT 1600 PECVD Chamber, and an exemplary thermal anneal chamber is a rapid thermal anneal chamber, such as a lamp heated thermal anneal chamber. These chambers are available from Applied Materials, Inc.

Unique Problems Associated with Glass Substrate Processing

The fabrication of devices, such as plates for use in solar cells and video and computer monitors, makes use of glass substrates. Often, thin film transistors are etched onto the glass substrates. The fabrication of such devices is done in a system that uses many of the same processes and chambers used to fabricate semiconductor devices. For instance, U.S. Pat. No. 5,512,320, Turner et al., discloses a representative system for processing glass substrates. U.S. Pat. No. 5,441, 768, Law et al., U.S. Pat. No. 5,861,107, Law et al., and U.S. Pat. No. 5,928,732 Law et al., disclose methods for plasma-enhanced chemical vapor deposition on substrates such as glass. U.S. Pat. No. 5,607,009, Turner et al., discloses a heater chamber with an elevator assembly for heating glass substrates.

One product that relies on processing of glass substrates is flat panel displays. The manufacture of a flat panel display begins with a clean glass substrate. Transistors are formed on the flat panel using film deposition and selective etching techniques. Sequential deposition, photolithography and selective etching of film layers on the substrate create individual transistors on the substrate. These transistors, as well as metallic interconnects, liquid crystal cells and other devices formed on the substrate are then used to create active matrix display screens for flat panel displays.

Although the flat panel display is typically manufactured using the same processes as those used in semiconductor device fabrication, the glass used as the flat panel display substrate is different from a semiconductor substrate in certain aspects that affect processing and system design. In semiconductor fabrication, individual devices are formed on the wafer, and the wafer is diced to form multiple individual integrated circuits. Thus, the creation of some defective devices on the semiconductor wafer is tolerated, because the die bearing these defective devices are simply discarded once the substrate is cut into individual integrated circuits. In contrast, in a flat panel display, individual defective devices must not be removed. Therefore, the number of defective devices created on the flat panel substrate must approach zero. If a substrate is sufficiently large to allow multiple displays to be formed on a single substrate, a defect in any one of the flat panel displays being formed on the flat panel substrate renders the entire substrate useless. Thus, it is important that error rates are minimized in flat panel display fabrication systems.

An objective common to both semiconductor and glass substrate processing is the need to avoid, to the extent possible, exposing the substrate to contamination sources. Accordingly, conventional processing systems provide a closed environment in which the various chambers are sealed together. This presents special problems. For instance, in a typical semiconductor or glass substrate processing scheme, a heat chamber within the cluster tool system is used to subject the substrate to a very high temperature. Yet prior art apparatuses that couple a heat chamber to a central transfer chamber in a closed environment have not adequately addressed the heat problems that arise when a heat chamber is coupled to a central transfer chamber.

One drawback of prior art cluster tool systems, or other modular system architectures that have a heat chamber and/or another high temperature process chamber coupled to a central transfer chamber, is that thermal energy flows from the heat chamber or high temperature process chamber to the central transfer chamber at a significant rate. A reason for this significant flow of thermal energy is that the apparatus used to couple the heat chamber or high temperature process chamber to the central transfer chamber in prior art cluster tool systems, or other modular system architectures, is made of machined aluminum or aluminum alloys. Aluminum and aluminum alloys have a high thermal conductivity coefficient. Central transfer chamber exposure to excessive thermal energy raises the ambient temperature of the central transfer chamber. This temperature rise has a deleterious effect on moving parts within the central transfer chamber, such as the robot arm, and significantly reduces the lifetime of such parts.

As discussed above, prior art apparatuses used to couple a heat chamber or other high temperature process chamber to a central transfer chamber lose a considerable amount of thermal energy through the aperture used to ultimately connect the heat chamber or other high temperature process chamber to the transfer chamber. This heat loss causes a cold spot to arise within the heat chamber or other high temperature process chamber. This cold spot is undesirable because many of the processes carried out in a heat chamber or other high temperature process chamber require that the temperature be uniform across the entire substrate. If one section of the heat chamber or other high temperature process chamber has a cold spot, it is difficult to maintain substrate temperature uniformity.

Accordingly, there is a need in the art for an improved apparatus for coupling two chambers in a closed environment. In particular, there is a need in the art for an apparatus that couples two chambers and minimizes the amount of heat that is transferred between the two chambers. Such an apparatus would be particularly useful for connecting a heat chamber or other high temperature process chamber to a central transfer chamber in the closed environment of a cluster tool system or other modular architecture used to process glass substrates.

SUMMARY OF THE INVENTION

The present invention provides an improved apparatus for connecting a heat chamber or another high temperature process chamber to a second chamber, such as a central transfer chamber, in a closed environment suitable for modular architecture based substrate processing in such a manner that heat transfer from the heat chamber or another high temperature process chamber to the second chamber is minimized. The apparatus of the present invention includes a thermally isolating interface, which has a reduced thermal conductivity coefficient, that abuts the second chamber. This thermally isolating interface reduces the amount of heat that is transferred from the heat chamber or other high temperature process chamber to the second chamber. Furthermore, in some embodiments of the present invention, the thermally isolating interface includes one or more recesses so that the surface area between the thermally isolating interface and the second chamber is minimized. Reduction in this surface area, in turn, minimizes thermal transfer between the heat chamber or other high temperature process chamber and the second chamber. Thus, the apparatus of the present invention prolongs the life of moving parts in the second chamber, such as the robot arm.

In some embodiments of the present invention, the apparatus includes a heating device to prevent heat loss from the second chamber. In many substrate processing regimens, maintenance of a uniform temperature within the second chamber is an important requirement. The inclusion of a heating device in the apparatus of the present invention prevents heat loss through the aperture to the second chamber. Furthermore, the inclusion of a heating device in the apparatus of the present invention lowers the potential temperature differential across large substrates that pass through the apparatus. The reduction in temperature differential across the substrate potentially reduces stress on the substrate, particularly in processing regiments that require the substrate to pass into the second chamber several times.

One embodiment of the present invention provides an apparatus through which a substrate may be transferred between a first chamber, such as a heat chamber or other high temperature process chamber, and a second chamber, such as a central transfer chamber. The first chamber is maintained at a high temperature relative to the temperature maintained within the second chamber. The apparatus comprises: (i) a passageway for receiving the substrate and (ii) a thermally isolating interface that reduces heat transfer from the first chamber to the second chamber. The thermally isolating interface has a hole in the face of the interface that abuts a port into the second chamber. The hole has dimensions such that the substrate is transferrable through the interface, thereby allowing for substrate transfer between the first chamber and the second chamber.

In some embodiments of the present invention, the thermally isolating interface is composed of a material having a thermal conductivity coefficient less than that of aluminum, which is about 1536 Btu inch/(hr)(ft$^2$)(° F.). In yet other embodiments, the thermally isolating interface is composed of a material having a thermal conductivity coefficient of less than 1200 Btu inch/(hr)(ft$^2$)(° F.). In still other embodiments of the present invention, the thermally isolating interface is composed of an austenitic, martensitic steel, or ferritic steel. In one aspect of the present invention, the thermally isolating interface is composed of stainless steel. In one embodiment in accordance with this aspect of the invention, the thermally isolating interface is composed of a stainless steel having a thermal conductivity coefficient of about 106 Btu inch/(hr)(ft$^2$)(° F.).

In some embodiments of the present invention, the face of the thermally isolating interface includes one or more recesses such that an enclosed volume is defined within the recess when the face abuts the port of the second chamber. In some embodiments, this enclosed volume remains empty or is occupied by an insulating material. In general, whatever occupies the enclosed volume has a thermal conductivity coefficient of less than that of aluminum. For example, in one embodiment, the enclosed volume is simply air, which has a thermal conductivity of 0.18 Btu inch/(hr)(ft$^2$)(° F.). Because whatever occupies the enclosed volume has a thermal conductivity less than that of aluminum, the enclosed volume is referred to herein as a thermally isolating volume.

The present invention contemplates a large number of different shaped recesses all of which are in accordance with the present invention. For example, in one embodiment, the recess is beveled. In other embodiments, the shape of the recess is best described in terms of the shape of a cross section of the recess. The shape of the cross section of some recesses in accordance with these embodiments is alternatively defined by a sawtooth pattern, a repeating pattern, a curve or a polynomial equation.

In selected embodiments of the present invention, the passageway through which the substrate is passed includes a heating element for maintaining the passageway at a temperature that is proximate to the temperature of the heat chamber and/or another high temperature process chamber such as a chemical vapor deposition (CVD) chamber. In some embodiments, this heating element is a coil wrapped around a ceramic base. Further, in some embodiments the heat from the heating element is distributed by a distribution mechanism such as a reflective surface. In a preferred embodiment, this reflective surface is a parabolic mirror.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted however, that the appended drawings illustrate only typical embodiments of this invention and are therefore not to be considered limiting to its scope, for the invention may admit to other equally effective embodiments.

Like reference numerals refer to corresponding parts throughout the several views of the drawings.

DETAILED DESCRIPTION OF THE PREFERRED EMBODIMENTS

The present invention provides an improved apparatus for connecting two chambers in a closed environment. The improved apparatus minimizes heat transfer from the two chambers by including an improved interface. In some embodiments of the present invention, the improved interface is made of a material that has a reduced thermal conductivity coefficient. In other embodiments of the present invention, the interface includes one or more recesses so that the surface area between the interface and the second chamber is minimized. This surface area minimization reduces the amount of thermal energy that is transferred to the second chamber. In still other embodiments of the present invention, the apparatus includes a heating device to prevent heat loss near the aperture to the second chamber.

Figure 1B:
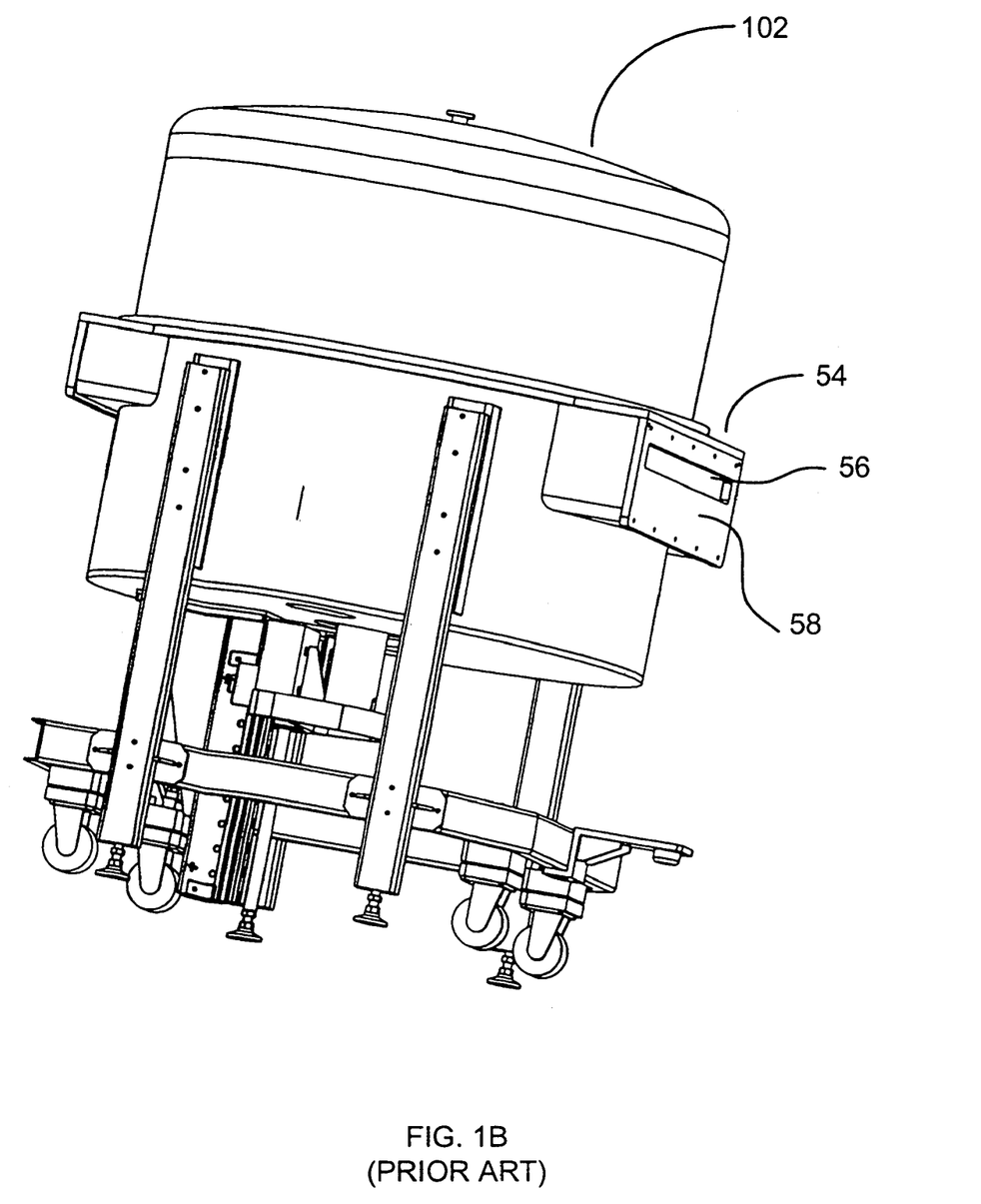
FIG. 1B is a plan view of a prior art heat chamber that includes a prior art apparatus for coupling the heat chamber to a second chamber.

FIG. 1B discloses a conventional heat chamber 102 with a prior art apparatus 54 including a hole 56 through which substrates are passed between the conventional heat chamber 102 and a second chamber such as a central transfer chamber. A closed environment between heat chamber 102 and a second chamber is maintained by bolting and sealing the interface 58 of apparatus 54 to a similar interface on the second chamber.

Figure 2:
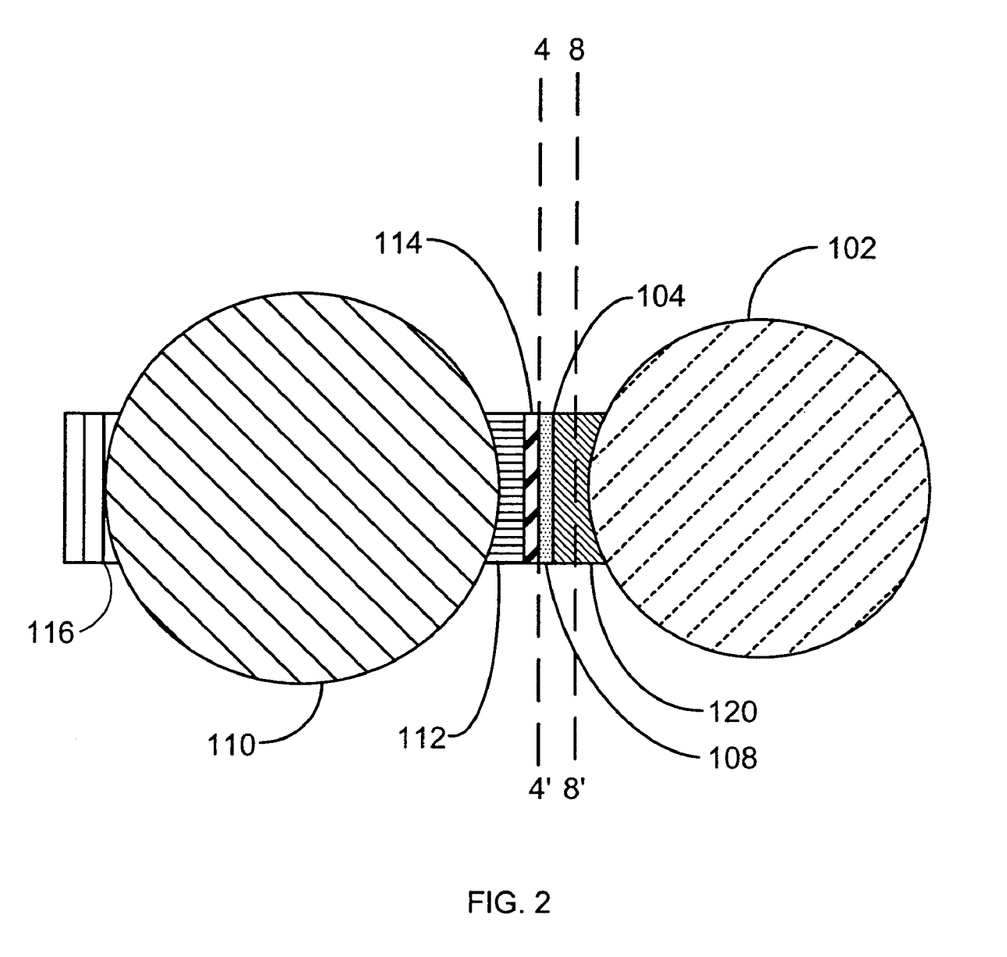
FIG. 2 is a top view of a schematic of a system incorporating the present invention.

Referring to FIG. 2, a plan view is disclosed of a schematic of a modular architecture incorporating an apparatus 104 of the present invention. FIG. 2 includes a schematic representation of heat chamber 102, chamber 110, and apparatus 104. While FIG. 2 discloses a heat chamber 102, the apparatus and methods of the present invention may, in fact, be used with any of a number of high temperature process chambers rather than a heat chamber. For example, chamber 102 could be a chemical vapor deposition (CVD) chamber. In one embodiment, heat chamber 102 is any form of chamber used to heat a substrate to a specified temperature. For instance, in some embodiments, heat chamber 102 is a batch-type heat chamber designed for glass substrates, such as that disclosed in U.S. Pat. No. 5,607,009, Turner et al. It will be appreciated that, because glass substrates are typically rectangular shaped, the plan dimensions of the heat chamber in such embodiments is rectangular rather than the circular shape shown. In other embodiments, heat chamber 102 is a heat chamber designed for silicon substrates.

In some configurations of the present invention, chamber 110 is a central transfer chamber used in semiconductor and/or glass substrate processing. A representative transfer chamber is disclosed in U.S. Pat. No. 5,512,320, Turner et al. Chamber 110 includes a port 112 with an interface 114. Central transfer chamber 10 is found in such products as the Precision 5000, Endura, Centura, Producer, and Endura SL, which are manufactured and sold by Applied Materials, Inc., located in Santa Clara, Calif.

Apparatus 104 is used to couple heat chamber 102 to chamber 110. Apparatus 104 is composed of a passageway 120 and a thermally isolating interface 108. Interface 114 and thermally isolating interface 108 are bolted and sealed together in such a manner that a closed environment is formed between heat chamber 102 and chamber 110. This closed environment enables heat chamber 102 and chamber 110 to maintain a vacuum.

Figure 3:
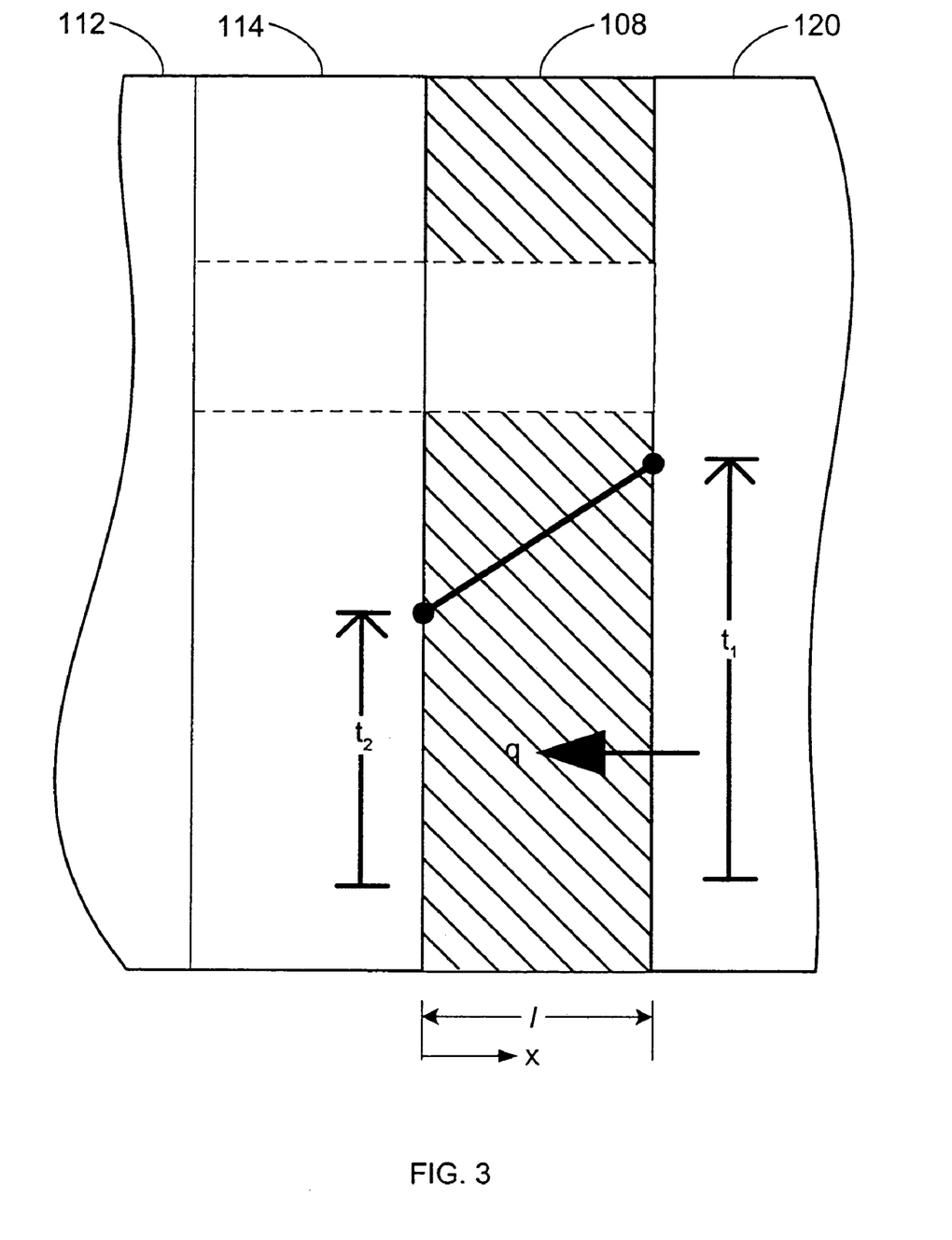
FIG. 3 is a side view of a schematic of a thermally isolating interface in accordance with one embodiment of the present invention.

An important advantage of the present invention is that heat transfer between apparatus 104 and chamber 110 is reduced by forming a thermally isolating interface 108 from a material having thermal conductivity that is less than that of aluminum or aluminum alloy. The advantage of such construction will be appreciated by reference to FIG. 3 in which a schematic view of thermally isolating interface 108 is depicted. Thermally isolating interface 108 is coupled to passageway 120 and to interface 114 of port 112. Because passageway 120 is communicatively coupled to heat chamber 102, it is at a high temperature $t_1$ during normal operation. And because interface 114 is communicatively coupled to port 112 and chamber 110, it is at some lower temperature $t_2$. Because $t_1$ is higher than $t_2$, the direction of heat flow, q, is from passageway 120 to interface 114 and ultimately to chamber 110 through port 112 (FIG. 2).

An important aspect of the present invention is that thermally isolating interface 108 is composed of a material having a thermal conductivity coefficient of less than that of aluminum so that heat transfer between heat chamber 102 and chamber 110 (FIG. 2) is reduced. Accordingly, materials that can be used to make thermally isolating interface 108 include any machinable material that has a thermal conductivity coefficient less than that of aluminum. In some embodiments, the material used to make thermally isolating interface 108 can withstand temperatures up to about 625° C. or more without melting. In other embodiments, the material used to make thermally isolating interface 108 can withstand temperatures, such as about 100° C. to about 550° C., without melting.

While reference is made to the material used to make thermally isolating interface 108, it will be appreciated that passageway 120 could also be made from material having a thermal conductivity coefficient of less than that of aluminum. Further, in some embodiments, passageway 120 and thermally isolating interface 108 may be a single part.

Reference to a wide range of materials that are suitable for use in the present invention may be found in *Marks' Standard Handbook for Mechanical Engineers*, Ninth Edition, Avallone & Baumeister III eds., McGraw-Hill Inc., New York, including the Table at 6–11. Thus, possible materials for thermally isolating interface 108 include, platinum, as well as various alloys of iron and chromium including steel with an American Iron and Steel Institute designation of C1020 (hot-worked) or 304 (sheet). However, in a preferred embodiment, the material used for thermally isolating interface 108 is any common form of stainless steel.

Figure 4:
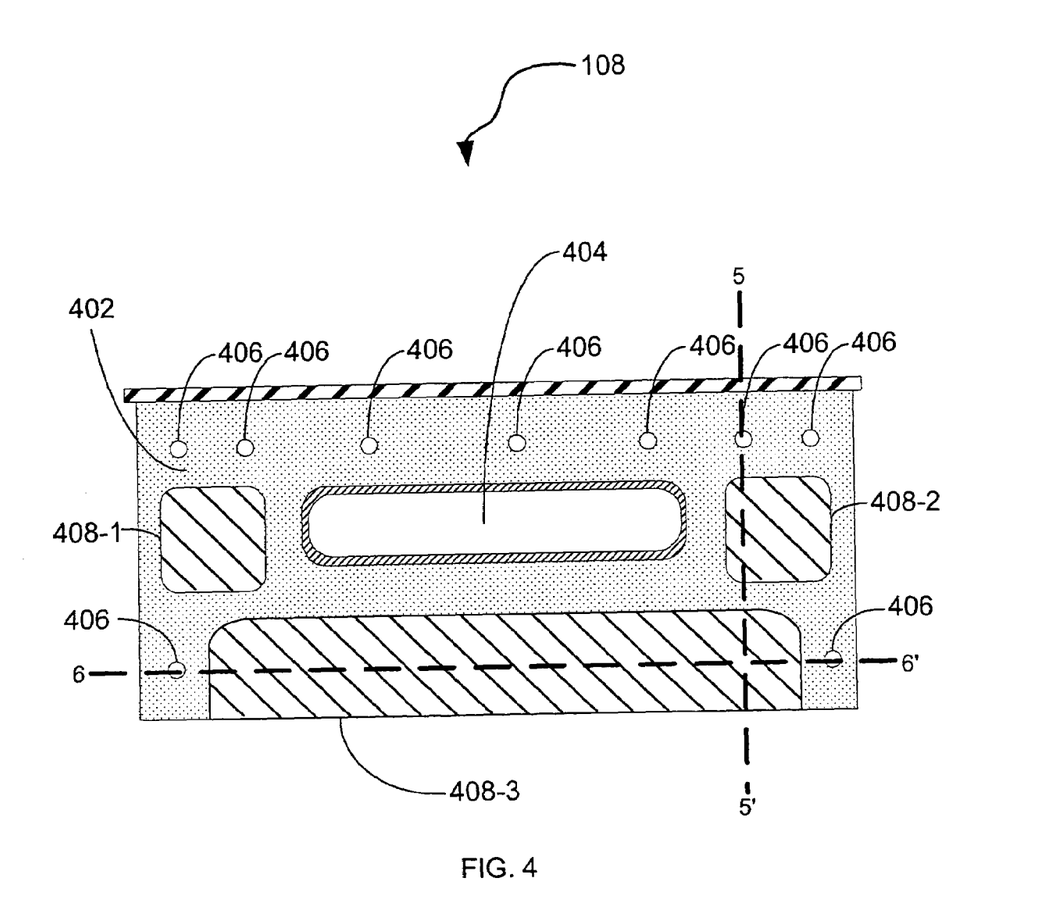
FIG. 4 is a schematic view of a thermally isolating interface in accordance with one embodiment of the present invention.

Reference will now be made to FIG. 4 in order to illustrate additional features of certain embodiments of the present invention. FIG. 4 represents a schematic view of thermally isolating interface 108 along line 4–4' shown in FIG. 2, in accordance with one embodiment of the present invention. Thus, FIG. 4 represents a face 402 of thermally isolating interface 108 that is bolted onto interface 114 of port 112 (FIG. 2). Face 402 defines a hole 404 in the thermally isolating interface 108 having dimensions such that a substrate is transferrable through thermally isolating interface 108. Bolt holes 406 in face 402 serve as holes for bolts (not shown) used to bolt and seal thermally isolating interface 108 to interface 114 of port 112.

An important feature of face 402 is the presence of one or more recesses 408. In a typical embodiment, a recess 408 is made by milling a portion of face 402 to form a cavity. A recess 408 has the effect of reducing the amount of surface area on face 402 that comes into contact with interface 114 when face 402 is bolted and sealed onto interface 114 of port 112 (FIG. 2), thus reducing the amount of heat flow Q [Eq. (1)] from heat chamber 102 to chamber 110. While three recesses (408-1, 408-2, and 408-3) are shown in the embodiment illustrated in FIG. 4, it will be appreciated that any number of recesses may be milled into face 402 provided that a closed environment may still be formed when thermally isolating interface 108 is bolted to interface 114 of port 112 (FIG. 2). When thermally isolating interface 108 is bolted to interface 114, an enclosed volume is defined by the walls of the recess and the abutting portion of interface 114. In some embodiments, this enclosed volume remains empty or is occupied by an insulating material. In general, whatever occupies the enclosed volume, whether it is an insulating material or air, has a thermal conductivity coefficient of less than that of aluminum, which is about 1536 Btu inch/(hr)(ft$^2$)(° F.). Therefore, the enclosed volume is referred to herein as a thermally isolating volume.

Figure 5:
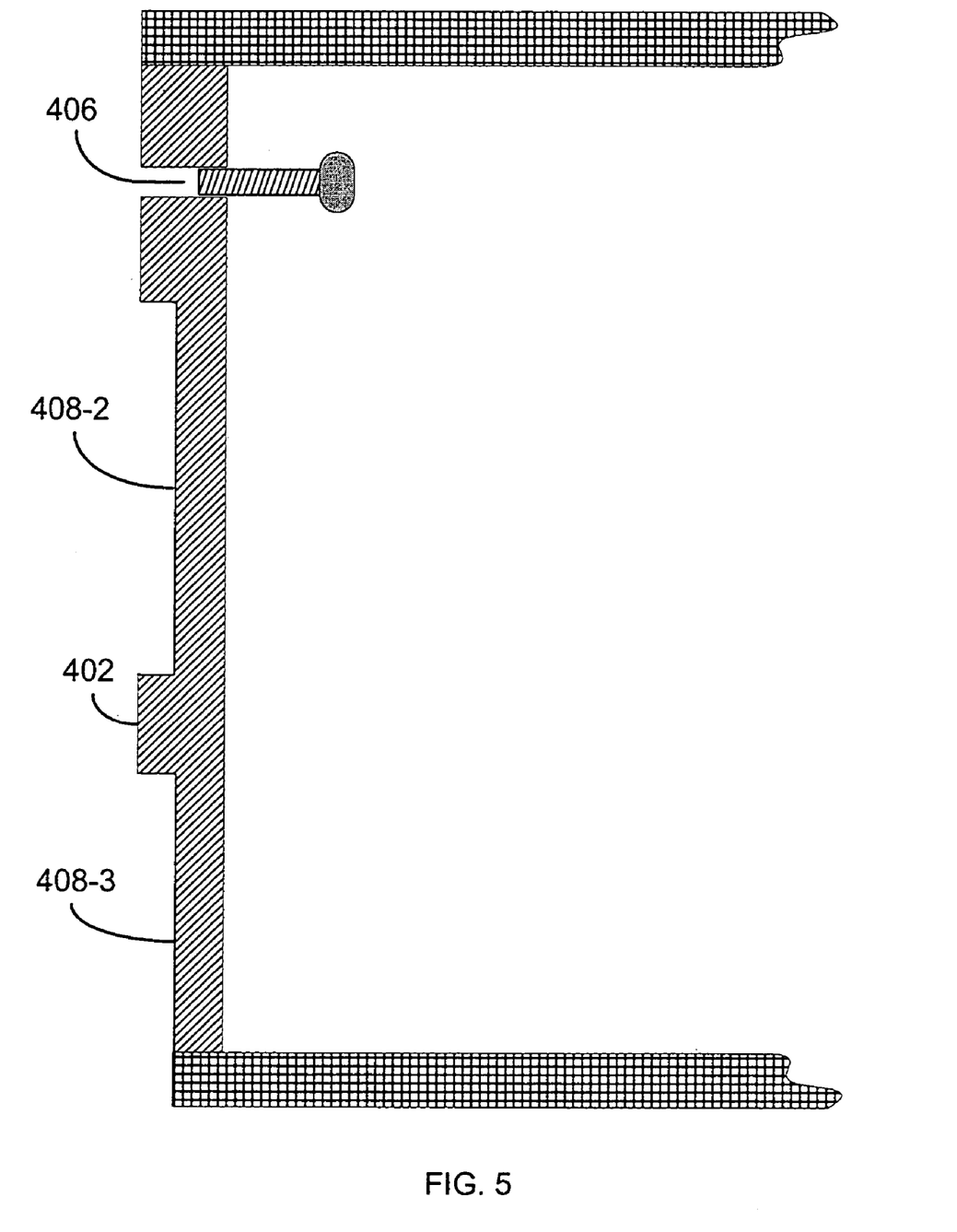
FIG. 5 is a diagrammatic cross-sectional view of a thermally isolating interface in accordance with one embodiment of the present invention.

FIG. 5 shows a cross-sectional view of recesses 408-2 and 408-3 within thermally isolating interface 108 along vertical line 5–5' drawn in FIG. 4. As seen in FIG. 5, each recess 408 reduces the surface area of face 402 that comes into contact with interface 114 (FIG. 2), thereby reducing the amount of heat flow Q [Eq. (1)] from heat chamber 102 to chamber 110.

Figure 6:
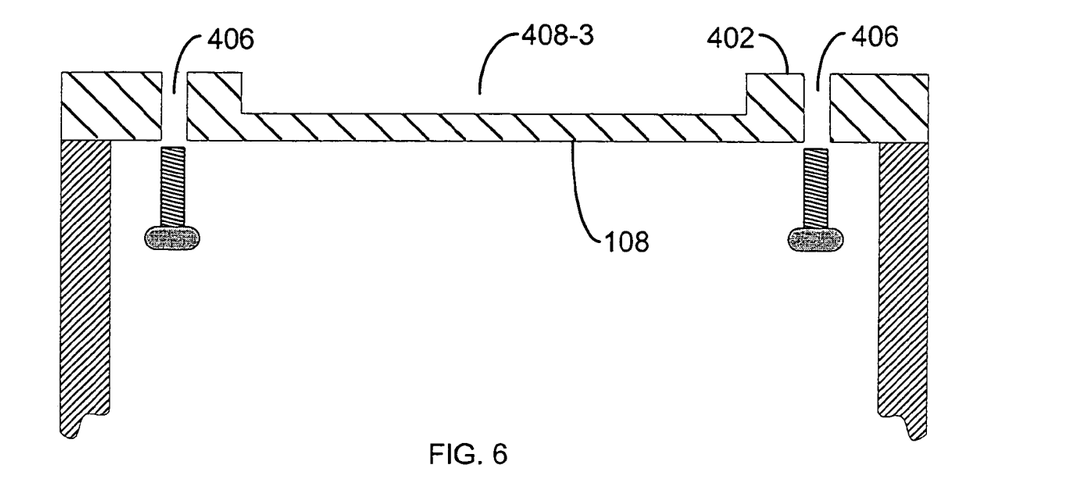
FIG. 6 is a diagrammatic cross-sectional view of a thermally isolating interface that features a first embodiment of a shaped recess.
Figure 7:
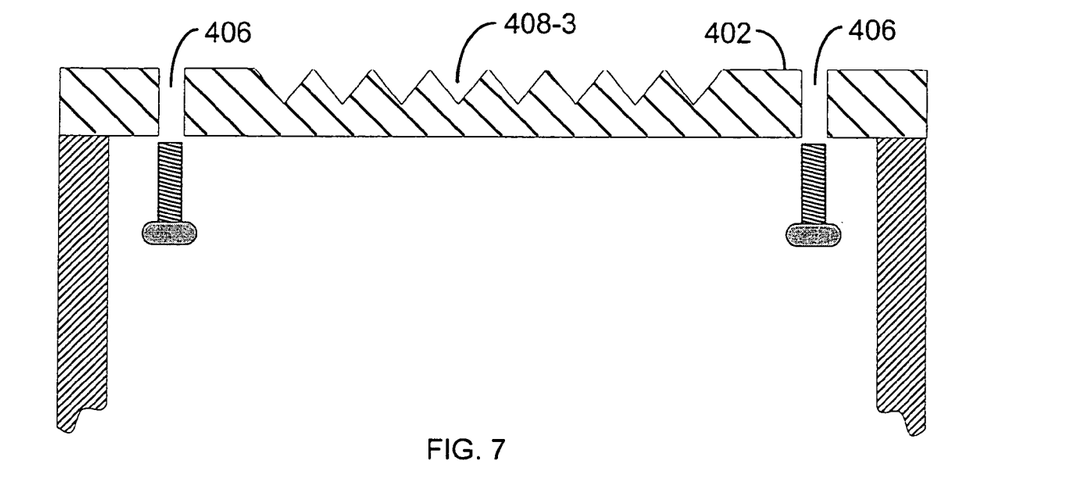
FIG. 7 is a diagrammatic cross-sectional view of a thermally isolating interface that features a second embodiment of a shaped recess.

Turning attention to FIG. 6, which is a cross-sectional view of recess 408-3 along horizontal line 6–6' of FIG. 4, additional features found in some embodiments of the present invention are shown. FIG. 6 highlights the shape of recess 408-3. In some embodiments, which are not illustrated, recess 408-3 is beveled. In still other embodiments, a cross-section of recess 408-3 has a shape that can be described as a sawtooth pattern. Such a pattern is illustrated in FIG. 7. However, it will be appreciated that recess 408 may have a wide number of different shapes including, but not limited to, any form of repeating pattern, a curve, or a shape determined by a polynomial equation.

Figure 8:
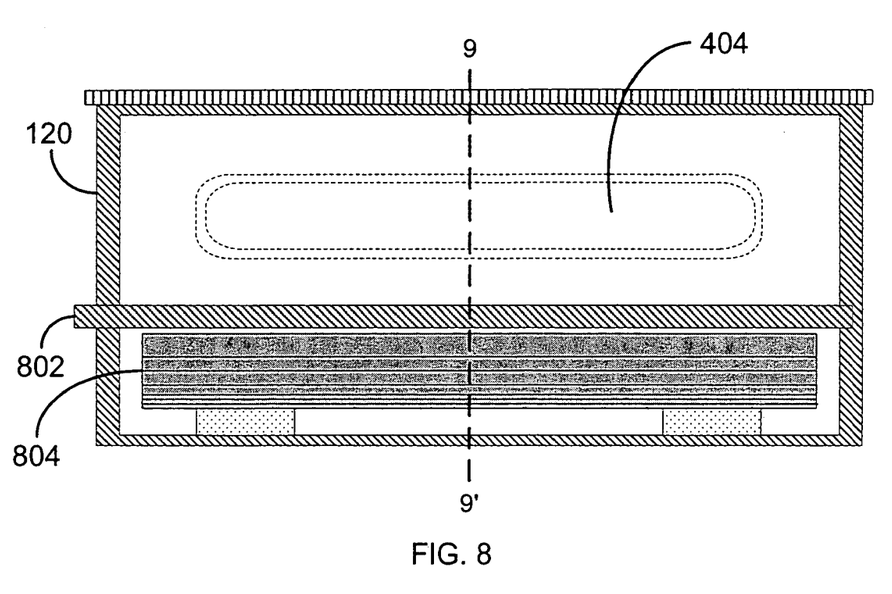
FIG. 8 is a diagrammatic cross-sectional view of the passageway of an apparatus of the present invention that includes a heating element and a heat distribution mechanism.

FIG. 8 illustrates another feature found in some embodiments of the present invention. FIG. 8 is a diagrammatic cross-sectional view of passageway 120 along line 8–8' of FIG. 2. For perspective, FIG. 8 includes a representation of the position of hole 404 (dashed lines) that is present in thermally isolating interface 108.

Representative central transfer chambers, such as chamber 110, include a slit valve (not shown) that opens in port 112 when a substrate is exchanged between chamber 110 and 102 (FIG. 2). When this slit value is open, a large amount of heat loss occurs through hole 404 in apparatus 104. This results in a cold spot within passageway 120 of apparatus 104. To alleviate this cold spot, some embodiments of the present invention include a heating element. This heating element maintains apparatus 104 at a temperature that is proximate to the temperature of heating chamber 102. For example, if heating chamber 102 is maintained at a temperature from 250° C. to 625° C., the heating element may maintain apparatus 104 at a temperature between about 40° C. to about 550° C., depending on the processes supported by a specific modular architecture. In some embodiments, the heating element may maintain apparatus 104 at a temperature from about 50° C. to about 500° C. In still other embodiments, heating element may maintain apparatus 104 at a temperature from about 70° C. to about 300° C. In some embodiments of the present invention, chamber 102 operates at a temperature as high as 550° C. and the heating element is operated at a temperature that reduces heat loss from chamber 102. In any event, it will be appreciated that the heating element can maintain apparatus 104 at temperatures in ranges not explicitly mentioned herein and that any such temperature range is within the scope of the present invention so long as the temperature range facilitates a semiconductor or glass processing regimen.

The heating element 802 shown in FIG. 8 is a representative heating element in accordance with the present invention. In general, heating element 802 is any heating element capable of heating apparatus 104 to a suitable temperature without giving off particulate matter that will damage a substrate that is being processed. For example, heating element may be a tungsten coil wrapped around a ceramic base. In some embodiments, heating element 802 is cast in metal. Illustrative of such embodiments is the Watlow cast-in or interference fit (IFC) product line.

In some embodiments of the present invention, a heat distribution mechanism is used to distribute heat generated by heating element 802. Typically, the heat distribution mechanism is a reflective surface. In one embodiment, the reflective surface is a parabolic mirror. FIG. 8 illustrates a parabolic mirror 804 that is used to reflect heat generated from heating element 802.

Figure 9:
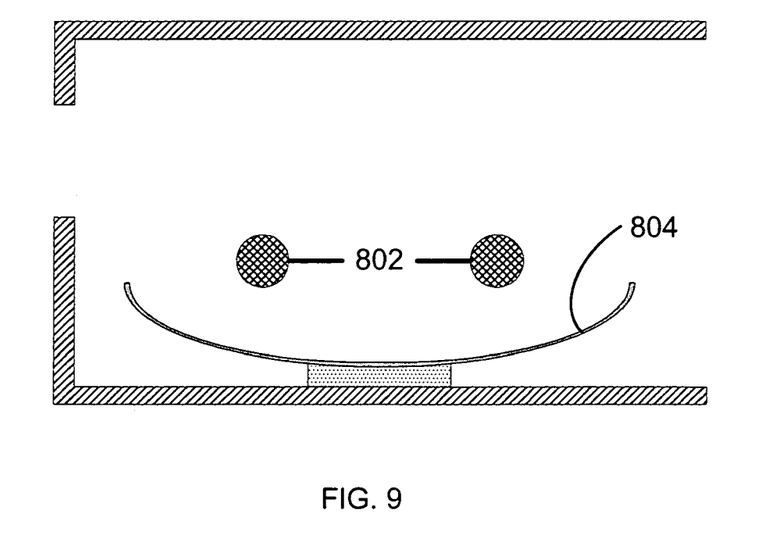
FIG. 9 is a diagrammatic cross-sectional view of FIG. 8.

FIG. 9 is a diagrammatic cross-sectional view along line 9–9' of FIG. 8 showing two heating elements 802. In practice, an apparatus 104 in accordance with the present invention may have any number of heating elements 802 and the presence of two heating elements 802 in FIG. 9 merely illustrates this point. FIG. 9 further shows how, in cross-sectional view, parabolic mirror 804 distributes heat from heating element 802. Thus, an apparatus 104 of the present invention is advantageous because it prevents the apparatus from being a heat sink to the heat chamber or other high temperature process chamber. As a result, apparatus 104 promotes temperature uniformity within the heat chamber or other high temperature process chamber.

While reference was made to glass substrates and silicon substrates, it will be appreciated that the teachings of the present invention are not limited to glass substrates or silicon substrates. Indeed, the apparatuses and methods of the present invention may be used for substrates that include, but are not limited to, glass panels, quartz, silica, fused silica, silicon, and doped silicon, gallium arsenide, as well as any other type of substrate that may be processed by modular architecture based systems. In fact, the methods of the present invention may be used for substrates composed of any of the III–IV semiconductors. Furthermore, the substrates processed in accordance with the apparatuses and methods of the present invention may be round, rectangular, or any other suitable shape. In particular, in some embodiments, the substrates processed by the present invention are noncircular substrates having an area greater than 400 $cm^2$. Exemplary substrates include, but are not limited to, rectangular or square substrates used in flat panel display fabrication having dimensions of, for example, about 370 mm×470 mm or larger. Substrates having rectangular dimensions as large as 1 meter×1.5 meter are contemplated as well.

All references cited herein are incorporated herein by reference in their entirety and for all purposes to the same extent as if each individual publication or patent was specifically and individually indicated to be incorporated by reference in its entirety for all purposes.

The foregoing descriptions of specific embodiments of the present invention are presented for purposes of illustration and description. They are not intended to be exhaustive or to limit the invention to the precise forms disclosed. Obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. An apparatus through which a substrate is transferred between a first vacuum chamber and a second vacuum chamber, wherein said first vacuum chamber is maintained at a high temperature relative to a temperature maintained within said second vacuum chamber, said second vacuum chamber including a port; said apparatus comprising:

a passageway for receiving said substrate; and a thermally isolating interface that reduces heat transfer from said first vacuum chamber to said second vacuum chamber, said thermally isolating interface allowing for transfer of said substrate between said apparatus and said second vacuum chamber, said thermally isolating interface having a face with a border disposed on said face, the border defining a hole in said thermally isolating interface having dimensions such that said substrate is transferable through said thermally isolating interface;

wherein said thermally isolating interface is made of a metal having a thermal conductivity coefficient of less than about 1536 Btu inch/(hr)($ft^2$)(° F.);

wherein said first vacuum chamber, said apparatus, and said second chamber are sealed together to form a closed environment having an internal pressure that is less than standard atmospheric pressure; and wherein said face includes a beveled recess such that, when said face abuts said port, a thermally isolating volume is defined within said recess.

2. The apparatus of claim 1 wherein said first vacuum chamber is a heat chamber or a high temperature processing chamber and said second vacuum chamber is a transfer chamber.

3. The apparatus of claim 1 wherein said thermally isolating interface comprises stainless steel.

4. The apparatus of claim 1 wherein said thermally isolating interface comprises stainless steel having a thermal conductivity coefficient of about 106 Btu inch/(hr)(ft$^2$)(° F.).

5. The apparatus of claim 1 wherein said thermally isolated volume is occupied by a composition having a thermal conductivity coefficient of less than about 1200 Btu inch/(hr)(ft$^2$)(° F.).

6. The apparatus of claim 5 wherein said composition is air or an insulating material.

7. The apparatus of claim 1 wherein said passageway further comprises a heating element for maintaining said apparatus at a temperature that is proximate to said high temperature.

8. The apparatus of claim 7 wherein said passageway further comprises a heat distribution mechanism for distributing heat generated by said heating element.

9. The apparatus of claim 8 wherein said heat distribution mechanism includes a reflective surface.

10. The apparatus of claim 9 wherein said heat distribution mechanism includes a parabolic mirror.

11. The apparatus of claim 1 wherein said substrate is a semiconductor substrate or a glass substrate.

12. An apparatus through which a substrate is transferred between a first vacuum chamber and a second vacuum chamber, wherein said first vacuum chamber is maintained at a high temperature relative to a temperature maintained within said second vacuum chamber, said second vacuum chamber including a port; said apparatus comprising:
a thermally isolating interface that reduces heat transfer from said first vacuum chamber to said second vacuum chamber, said thermally isolating interface allowing for transfer of said substrate between said apparatus and said second vacuum chamber, said thermally isolating interface having a face with a border disposed on said face, the border defining a hole in said thermally isolating interface having dimensions such that said substrate is transferable through said thermally isolating interface;
wherein said thermally isolating interface is made of a metal having a thermal conductivity coefficient of less than about 1536 Btu inch/(hr)(ft$^2$) (° F.);
wherein said first vacuum chamber, said apparatus, and said second chamber are sealed together to form a closed environment having an internal pressure that is less than standard atmospheric pressure; and
wherein said face includes a beveled recess such that, when said face abuts said port, a thermally isolating volume is defined within said recess.

13. The apparatus of claim 12 wherein said first vacuum chamber is a heat chamber or a high temperature processing chamber and said second vacuum chamber is a transfer chamber.

14. The apparatus of claim 12 wherein said thermally isolated volume is occupied by a composition having a thermal conductivity coefficient of less than about 1200 Btu inch/(hr)(ft$^2$)(° F.).

15. An apparatus through which a substrate is transferred between a first vacuum chamber and a second vacuum chamber, wherein said first vacuum chamber is maintained at a high temperature relative to a temperature maintained within said second vacuum chamber, said second vacuum chamber including a port; said apparatus comprising:
a thermally isolating interface that reduces heat transfer from said first vacuum chamber to said second vacuum chamber, said thermally isolating interface allowing for transfer of said substrate between said apparatus and said second vacuum chamber, said thermally isolating interface having a face with a border disposed on said face, the border defining a hole in said thermally isolating interface having dimensions such that said substrate is transferable through said thermally isolating interface;
wherein said first vacuum chamber, said apparatus, and said second chamber are sealed together to form a closed environment having an internal pressure that is less than standard atmospheric pressure; and
wherein said face includes a beveled recess such that, when said face abuts said port, a thermally isolating volume is defined within said recess.

16. The apparatus of claim 1 wherein a cross-section of the beveled recess includes a saw tooth pattern shape.

17. The apparatus of claim 12 wherein a cross-section of the beveled recess includes a saw tooth pattern shape.

18. The apparatus of claim 15 wherein a cross-section of the beveled recess includes a saw tooth pattern shape.

* * * * *